United States Patent
Rey

(10) Patent No.: US 10,862,505 B1
(45) Date of Patent: Dec. 8, 2020

(54) ARBITRARY RATE DECIMATOR AND TIMING ERROR CORRECTOR FOR AN FSK RECEIVER

(71) Applicant: NXP USA, Inc., Austin, TX (US)

(72) Inventor: Claudio Gustavo Rey, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/803,257

(22) Filed: Feb. 27, 2020

(51) Int. Cl.
  *H03M 3/00* (2006.01)
  *H03H 17/06* (2006.01)
  *H04L 27/14* (2006.01)

(52) U.S. Cl.
  CPC ........ *H03M 3/462* (2013.01); *H03H 17/0664* (2013.01); *H03H 17/0671* (2013.01); *H03M 3/418* (2013.01); *H04L 27/14* (2013.01)

(58) Field of Classification Search
  CPC ...... H03M 3/418; H03M 3/462; H03M 3/458; H03M 3/02; H03M 3/372; H03M 1/12; H03M 1/66; H03H 17/0664; H03H 17/0617
  USPC ................................. 341/118–155
  See application file for complete search history.

(56) References Cited

U.S. PATENT DOCUMENTS

| | | | |
|---|---|---|---|
| 4,775,851 A * | 10/1988 | Borth | ................. H03H 17/0225 341/155 |
| 5,157,395 A | 10/1992 | Del Signore et al. | |
| 5,361,046 A | 11/1994 | Kaewell, Jr. et al. | |
| 5,410,498 A | 4/1995 | Staver | |
| 5,619,202 A | 4/1997 | Wilson et al. | |
| 5,621,675 A | 4/1997 | Linz et al. | |
| 5,838,270 A * | 11/1998 | Kiriaki | .................. H03M 3/448 341/143 |
| 6,233,594 B1 | 5/2001 | Tan et al. | |

(Continued)

FOREIGN PATENT DOCUMENTS

| | | |
|---|---|---|
| EP | 1297626 B1 | 1/2008 |
| KR | 101405415 B1 | 6/2014 |
| WO | WO 02063842 A2 | 8/2002 |

OTHER PUBLICATIONS

Olga Joy L. Gerasta et al., 2-1, 2-2 and 2-1-1-MASH Delta-Sigma Modulator for 18-Bit Audio Digital to Analog Converter, International Journal of Electronics and Electrical Engineering, vol. 3, No. 1, Feb. 2015, pp. 44-49.

(Continued)

*Primary Examiner* — Lam T Mai

(57) ABSTRACT

An arbitrary rate digital decimator filter (204) and associated method are disclosed for filtering a digital data stream with a plurality of cascaded power-of-two decimator stages (205, 207) connected to receive the digital data stream and to generate a first filtered digital signal which is provided to a fractional resampling stage (211) which generates a second filtered digital signal with delta-sigma modulator (310) and a limited integrator stage (320) connected to receive a first control (301) word and a feedback clock signal (305) with inserted or swallowed pulses which is generated by a clock generator in response to pulse commands generated by the limited integrator stage, wherein the limited integrator is configured to generate time shift commands (303) to a timing shift filter (340) which performs fractional interpolation on the first filtered digital signal to generate the second filtered digital signal.

20 Claims, 5 Drawing Sheets

(56) References Cited

U.S. PATENT DOCUMENTS

| | | | |
|---|---|---|---|
| 6,282,248 | B1 | 8/2001 | Farrow et al. |
| 6,295,325 | B1 | 9/2001 | Farrow et al. |
| 6,507,300 | B1 | 1/2003 | Qian et al. |
| 6,650,258 | B1 | 11/2003 | Kelly et al. |
| 6,856,655 | B1 | 2/2005 | Garcia |
| 7,102,548 | B1 | 9/2006 | Wang et al. |
| 7,196,648 | B1 | 3/2007 | Ding et al. |
| 7,200,196 | B2 | 4/2007 | Li et al. |
| 7,856,464 | B2 | 12/2010 | Tinker |
| 7,965,216 | B1* | 6/2011 | Petre .................... H03M 3/462 341/155 |
| 8,063,986 | B2 | 11/2011 | Wang |
| 8,306,174 | B2 | 11/2012 | Murphy et al. |
| 8,635,261 | B2 | 1/2014 | Tinker |
| 2002/0145546 | A1* | 10/2002 | May .................. H03H 17/0621 341/61 |
| 2008/0205571 | A1 | 8/2008 | Muhammad et al. |
| 2010/0219997 | A1 | 9/2010 | Le Guillou |
| 2012/0127009 | A1* | 5/2012 | Pagnanelli ............ H03M 3/468 341/143 |
| 2013/0207822 | A1* | 8/2013 | Snelgrove ........... H03M 1/0639 341/143 |
| 2015/0097745 | A1* | 4/2015 | Chou .................... H01Q 5/335 343/767 |
| 2015/0372805 | A1* | 12/2015 | Yoon ...................... H03M 3/30 375/358 |
| 2016/0072520 | A1* | 3/2016 | Pagnanelli ............ H03M 3/404 341/143 |
| 2016/0341762 | A1* | 11/2016 | Waters ................. G01P 15/125 |
| 2016/0373125 | A1* | 12/2016 | Pagnanelli ............ H03M 3/468 |
| 2017/0134039 | A1* | 5/2017 | Landers ................ H03M 3/462 |
| 2017/0373893 | A1 | 12/2017 | Rey |
| 2019/0280698 | A1 | 9/2019 | Kearney et al. |

OTHER PUBLICATIONS

Ali Telli et al., Structured Tone Mitigation in 3rd and 4th Order MASH Delta-Sigma Modulators-Comparative Study, Proceedings of the 10th IEEE Annual Wireless and Microwave Technology Conference (WAMICON '09), May 2009.

* cited by examiner

ARBITRARY RATE DECIMATOR AND TIMING ERROR CORRECTOR FOR AN FSK RECEIVER

BACKGROUND OF THE INVENTION

Field of the Invention

The present invention is directed in general to field of digital communication systems. In one aspect, the present invention relates to a digital decimation filter for use with an analog-to-digital converter.

Description of the Related Art

In a variety of wireless or radio communication equipment applications, such as mobile phones, analog-to-digital converter and digital decimation filters are used to convert selected analog radio signals into digital signals before being demodulated. In conventional decimation filters, a digital signal is decimated with a digital decimation filter that reduces the sample rate of the digital signal by a predetermined decimation rate, but such digital decimation filters can be overly complex and/or have limited flexibility in being able to accommodate variations in the sampling rate of digital signals over time. With fixed decimation designs, conventional decimation filters are not able to flexibly or dynamically accommodate changes in the required bit sampling rate of the decimation filter with respect to the crystal frequency of the receiver's reference oscillator. For example, there are conventional decimation filter solutions which use a cascaded integrator-comb (CIC) filter or other fixed fractional decimation filters which can be used in a cascaded fashion as well, alone or in combination with a compensation digital filter, to generate reduced output sampling rates at one of a plurality of sampling rates (e.g., by providing an ADC that may be clocked at different rates). However, such fixed decimation filter designs cannot efficiently provide flexible decimation sampling rates to meet design requirements based on a single crystal frequency. Rather, the requirements demand the use of different reference crystal frequencies to meet de-sensing requirements (which arise from reference frequency harmonics). Furthermore, a flexible design is required in order to enable timing error corrections over large or unbounded ranges (which can arise from protocols that allow for very large over-the-air packets). As seen from the foregoing, the existing digital decimator solutions are extremely difficult at a practical level by virtue of the challenges with providing an arbitrary and adjustable digital decimation sampling rate without imposing performance limitations, circuit complexities, and/or cost increases in terms of additional device complexity, size and fabrication costs.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
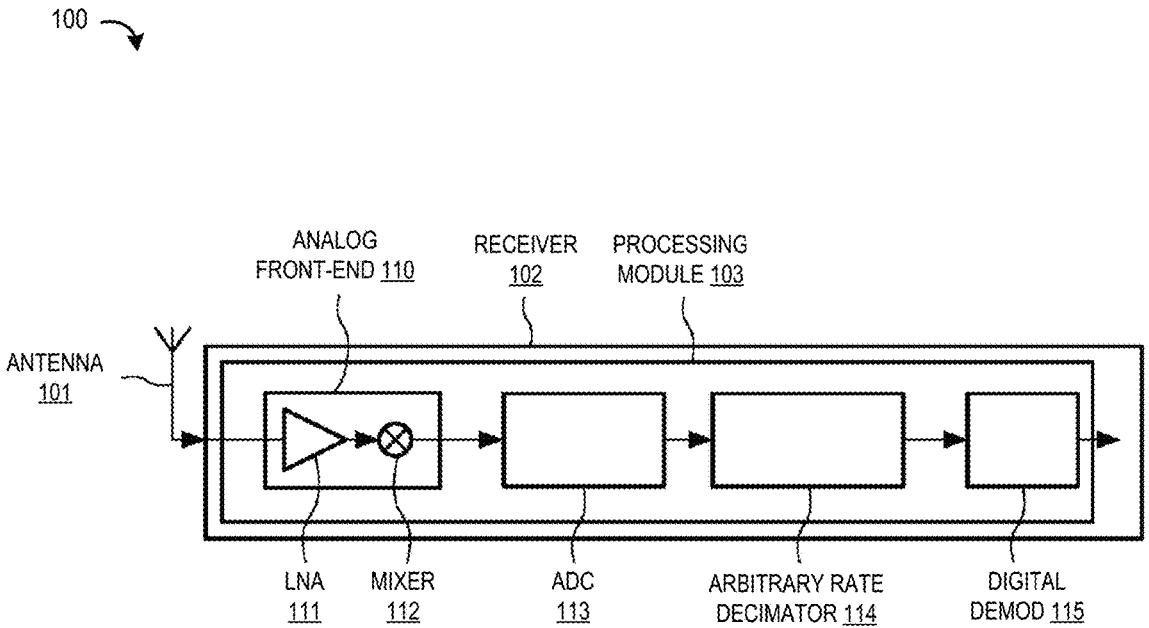
FIG. 1 depicts a simplified schematic block diagram of a receiver device in accordance with selected embodiments of the present disclosure.

An apparatus, system, architecture, methodology, and circuit are described for a receiver device, such as a frequency shift key (FSK) receiver, which provides an arbitrary rate digital decimation architecture which employs a cascaded sequence of power-of-two decimation filters connected over a channel filter to a delta-sigma fractional decimator which may be configured to provide arbitrary timing rate changes to the decimation filter sampling rate, alone or in combination with timing tracking adjustments to actively correct for timing drift. In selected embodiments for providing arbitrary timing rate changes, the arbitrary rate digital decimation architecture may be configured as a decimation/interpolation engine to provide an arbitrary overall decimation factor (e.g., 6000) by using the cascaded sequence of power-of-two decimation filters to provide a first decimation factor (e.g., 4096) and using the delta-sigma fractional decimator to provide a second decimation factor (e.g., 375/256, which is approximately 1.46484), providing the arbitrary overall decimation factor as a combination of the first and second decimation factors (e.g., 4096×375/256=6000). In selected embodiments, each of the cascaded sequence of decimation filters may be implemented with a cascaded integrator-comb (CIC) filter which provides specified power-of-two integer decimation. To control the number of stages, the first CIC decimator filter should not be a large order filter. In addition, a first automatic gain control and digital IF down-conversion mixer stage may be implemented after the first CIC filter to reduce its computational cost. In the second CIC decimator filter, for example, a large decimation factor may be required with the objective of providing a post-decimation bandwidth that is four times the required bandwidth to describe the sum of signal bandwidth and the maximum tolerated frequency error. In addition, a second automatic gain control and compensating FIR filter stage may be implemented after the second CIC filter to compensate for droop caused by the CIC decimator filters (and upstream analog filters) and to provide extra selectivity. Thus, a digital automatic gain control (AGC) stage may be included after each decimation filter stage to optimize the dynamic range and/or to reduce or minimize the word sizes at the output of each decimation filter stage. In addition, the cascaded sequence of decimation filters may, in selected embodiments, be followed by a half-band FIR-based decimator filter to perform a decimation-by-2 operation if the maximum tolerated frequency error is required to be large. In such embodiments, the half-band decimator should have a very flat frequency response. In selected embodiments, the delta-sigma fractional decimator may dynamically operate as either a decimation or interpolation engine to inject a delay or advance on the input sample rate, thereby applying small adjustment constants, the cumulative sum of which has no range restriction both in timing advance or retard of the output sampling rate. The disclosed fractional arbitrary resampler decimator may include a delta-sigma modulator and a limited integrator which are connected to generate pulse swallowing or pulse insertion commands, as needed, to a clock generator and to generate time shift commands to a timing shift filter. In selected embodiments for making timing tracking adjustments, the arbitrary rate digital decimation architecture may be configured to provide the additional function of timing error correction to actively correct for timing drift. To do so, the limited integrator may be supplied with gain-controlled timing corrections generated from small timing error estimates, thereby enabling the limited integrator to generate fractional time shift commands to the timing shift filter. In this way, the timing error correction can provide an unbounded timing correction range for the output sampling rate.

To provide additional details for an improved contextual understanding of the present disclosure, reference is now made to FIG. 1 which depicts a simplified schematic block diagram 100 of a receiver device 102 in which an arbitrary rate decimator 114 may be employed. It is important to notice that the present disclosure is not limited to receiver devices, but may be applied to transceiver devices, and more generally to any type of device adapted to receive analog radio signals to be converted into digital signals. For example, the following description will be described with reference to a receiver (or transceiver) device 102 that is used in a mobile communication equipment, such as a GSM or GPRS/EDGE or UMTS mobile phone, or Bluetooth or WLAN (Wireless Local Area Network) communication equipment, but the present disclosure is not limited to this type of radio communication equipment. For instance, it may also be used for television on mobile applications (DVB-H), and for all DVB standards (DVB-S, DVB-T or DVB-C, for instance).

As schematically illustrated in FIG. 1, the receiver device 102 includes an antenna 101 that is adapted to receive analog modulated signals and a processing module 103 that is fed with the received analog signals. The processing module 103 includes a low noise amplifier 111 arranged to amplify analog inputs signals received by the antenna 101, and also includes a mixer 112 which is configured to downmix or downconvert the analog input signal with one or more oscillator signals to produce a baseband analog signal. The mixer 112 is connected to feed the baseband analog signal to an analog-to-digital converter (ADC) 113, such as delta-sigma ADC, which converts the amplified analog signals into sampled digital signals. In turn, the ADC 113 is connected to feed the sampled digital signal to an arbitrary rate decimator filter 114 which is configured to provide channel filtering with an arbitrary sampling rate in accordance with the present disclosure. The filtered digital signals output from the arbitrary rate decimator filter 114 is fed to the digital demodulator 115 which is arranged to demodulate the filtered digital signals. As will be appreciated, the receiver device 102 may include additional circuit elements that are not shown, including but not limited to one or more analog front-end IQ clock generators, mixers, base-band filters (BBF), automatic gain control (AGC) circuits, and the like.

Figure 2:
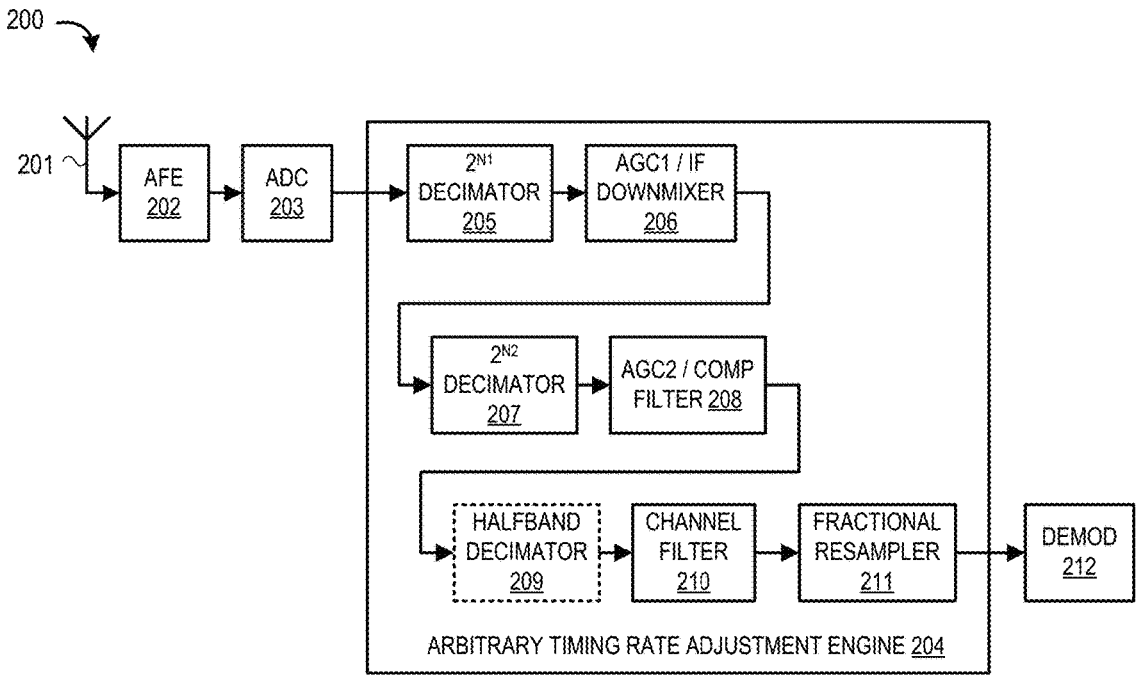
FIG. 2 depicts a block diagram of a receiver digital lineup that implements an arbitrary decimation solution in accordance with selected embodiments of the present disclosure.

To provide additional details for an improved understanding of selected embodiments of the present disclosure, reference is now made to FIG. 2 which depicts a block diagram of a receiver system 200 having a receiver digital lineup 201-212 that includes an arbitrary timing rate adjustment engine 204 which may be configured as a decimation/interpolation engine and/or a timing error correction engine for applications where the digital filter sampling bit rates arbitrarily change or drift. Although a number of components are illustrated in a particular arrangement in FIG. 2, the receiver system 200 may include additional or fewer components, and the receiver components may have a different arrangement than that shown.

The depicted receiver system 200 includes an antenna 201 for receiving an RF input signal that is supplied to an analog front-end (AFE) 202 which may be implemented with any suitable architecture. For example, the AFE 202 may include one or more signal paths for processing the RF input signal received at the antenna 201. Though not disclosed, it will be appreciated that each signal path may include a mixer for downmixing or downconverting the RF input signal into a baseband RF signal, a base-band filter (BBF) for passing signals having a frequency inside of a configured frequency interval, and a programmable base-band amplifier (BBA) which is configured to output an amplified RF input signal. The depicted analog front-end module 202 is coupled to an analog-to-digital converter (ADC) 203 which is configured to output a digital signal that represents the received amplified RF input signal. The digital signal supplied by the ADC 203 is connected to the arbitrary timing rate adjustment engine 204 which is configured to apply channel filtering, thereby generating a filtered digital signal at a specified output sampling rate. The filtered digital signal supplied by the arbitrary timing rate adjustment engine 204 is connected to the digital demodulator 212 which is connected and configured to demodulate the filtered digital signals. Each of the receiver components may be implemented, at least in part, as circuitry or as software in a digital signal processor (DSP).

In selected embodiments, the arbitrary timing rate adjustment engine 204 includes a cascaded sequence of power-of-two decimation filters 205, 207 connected over a channel filter 210 to a delta-sigma fractional decimator 211 to provide arbitrary timing rate adjustments to the decimation filter sampling rate. In operation, the one or more of the cascaded sequence of power-of-two decimation filters 205, 207 may be configured to provide a first decimation of the digital signal supplied by the ADC 203, and the delta-sigma fractional decimator may be configured to provide a fractional decimation of the filtered digital signal supplied by the one or more decimation filters 205, 207. Thus connected, the decimation function is broken into smaller decimation stages or blocks, thereby avoiding very large decimation filters.

In selected embodiments of the arbitrary timing rate adjustment engine 204, each of the decimation filters 205, 207 may be implemented with a cascaded integrator-comb (CIC) filter which provides specified power-of-two or integer decimation. For example, the first CIC filter 205 may be configured to provide a first (N1) power-of-two decimation (e.g., $2^{N1}$) and the second CIC filter 207 may be configured to provide a second (N2) power-of-two decimation (e.g., $2^{N2}$). To control the number of stages in the arbitrary timing rate adjustment engine 204, the first CIC decimator filter 205 should not be a large order filter in order to avoid the requirement of having a prohibitive number of stages in the CIC filter that arises with very large order filters. In selected embodiments, the first CIC decimator filter 205 has a maximum decimation factor of 16. An exemplary design rule of thumb will require the output bandwidth from the first CIC decimator filter 205 to be at least six times the signal bandwidth required to describe the sum of the intermediate frequency (IF) plus the maximum tolerated frequency error.

After each decimation filter stage 205, 207, a digital gain control stage 206, 208 may be included in order to benefit from the recovered processing gain. With the digital gain control stages 206, 208, the dynamic range of the decimation filter stages may be optimized and the word sizes at the outputs of the decimation filter stages may be reduce or minimized. For example, a first gain control stage AGC1 206 may be connected to receive the filtered digital signal from the first CIC filter 205 and to implement IF downconversion after the first CIC filter 205 to reduce the computational cost of downstream processing. In addition, a second gain control stage AGC2 208 may be connected to receive the filtered digital signal from the second CIC filter 207 and to implement compensation for the cascaded CIC responses and the analog front-end filter 202 at a lower sample rate. In the second CIC decimator filter 207, a large decimation factor may be required to get close to an adequately small sampling rate. As an exemplary design rule of thumb, the digital gain control stages 206, 208 are connected to immediately follow the corresponding CIC decimator filter 205, 207 as the word size at the output of the decimators can be very large, thereby optimizing the dynamic range and keeping the word sizes to a minimum. In another exemplary design rule of thumb, the second CIC decimator filter 207 may have a large decimation factor, with the objective of providing a post-decimation bandwidth that is four times the required bandwidth to describe the signal bandwidth plus the maximum tolerated frequency error.

In selected embodiments, the cascaded sequence of decimation filters 205, 207 may optionally be followed by a half-band decimator 209 if the required maximum tolerated frequency error is large. The optional nature of the third decimator 209 is indicated by the dashed lines. In such embodiments, the third half-band decimator 209 should have a very flat frequency response. Connected to the output of the last of the decimation filter stages 205, 207, 209 is a channel filter 210 which is configured to provide channel filtering to the digital signal before being supplied to the fractional decimator stage 211.

In addition, the delta-sigma fractional decimator 211 in the arbitrary timing rate adjustment engine 204 may be embodied with a delta-sigma modulator and limited integrator which are connected and configured to generate pulse swallowing or pulse insertion commands (as needed) to a clock generator and time shift commands to a timing shift filter, thereby functioning as either a decimation or interpolation engine to inject a delay or advance on the input sample rate by applying small adjustment constants. By constructing a delta-sigma fractional decimator 211 in hardware to dynamically operate as either a decimation or interpolation engine (as required on a sample-by-sample basis) to inject a delay or advance on the input sample rate, small adjustment constants may be applied, the cumulative sum of which has no range restriction both in timing advance or retard of the output sampling rate.

Figure 3:
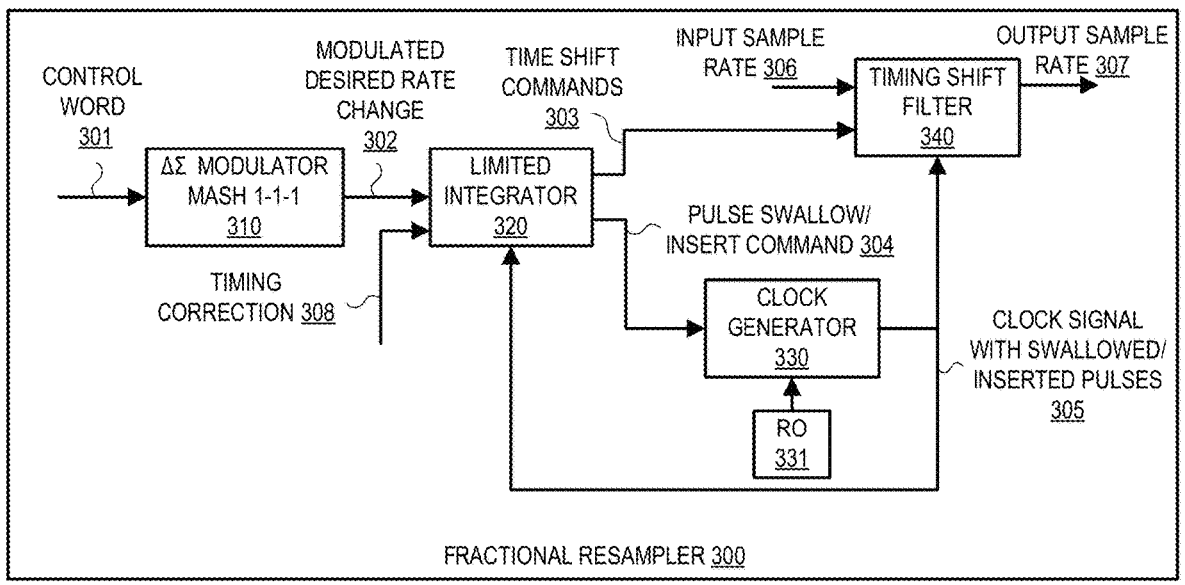
FIG. 3 depicts a simplified schematic circuit diagram of a fractional resampler device in accordance with selected embodiments of the present disclosure.

To provide additional details for an improved understanding of selected embodiments of the present disclosure, reference is now made to FIG. 3 which depicts a simplified schematic circuit diagram of a fractional resampler device 300 which may be used to implement either a decimation or interpolation engine and/or a timing correction engine, depending on control word 301 provided to the fractional resampler 300. In the depicted example embodiment, the fractional resampler 300 includes a timing shift filter 340 which implements a sampling rate conversion (SRC) process by converting a signal's input sampling rate 306 to an output sampling rate 307 in response to the time shift commands 303 and input clock signal 305. As will be understood by those skilled in the art, a timing shift filter will receive commands to indicate if the sampling timing or locations has been shifted forward (later) in time or has been shifted backward (earlier) in time. As a result, the output clock differs from the input clock by virtue of inserting additional clock pulses (in an interpolation process) or swallowing clock pulses (in a decimation process). By connecting a reference oscillator (RO) 331 to provide a reference oscillator signal, the clock generator 330 generates the clock signal 305 with swallowed or inserted pulses in response to the pulse swallow/insert commands 304, and this clock signal 305 is used by the timing shift filter 340.

In response to a first control word 301 having a fixed or predetermined value, the fractional resampler device 300 is configured as a decimation/interpolation engine which provides time shift commands 303 and an clock signal 305 to the timing shift filter 340 for implementing a rate change algorithm that can decimate between arbitrary factors between 1 and 2, and that can interpolate between arbitrary factors between 1 and 2. In this decimation/interpolation engine configuration, the fractional resampler device 300 receives the first control word 301 which specifies the desired decimation ratio for the fractional resampler 300. In response to the first control word 301, the delta-sigma modulator 310 generates a modulated desired rate change signal 302 which is injected into the limited integrator 320 where it is accumulated or integrated with the feedback clock signal 305 from the clock generator 330, thereby generating fractional time shift (or interpolation) commands 303 and pulse swallowing/pulse insertion commands 304. The delta-sigma modulator (DSM) 310 may be implemented with any suitable design for converting the input control word signal 301 to an output digital signal 302 indicating, on average, the modulated desired rate change, including but not limited to a DSM-based Multi-stAge noise SHaping (MASH) circuit (a.k.a., MASH DSM).

Figure 4:
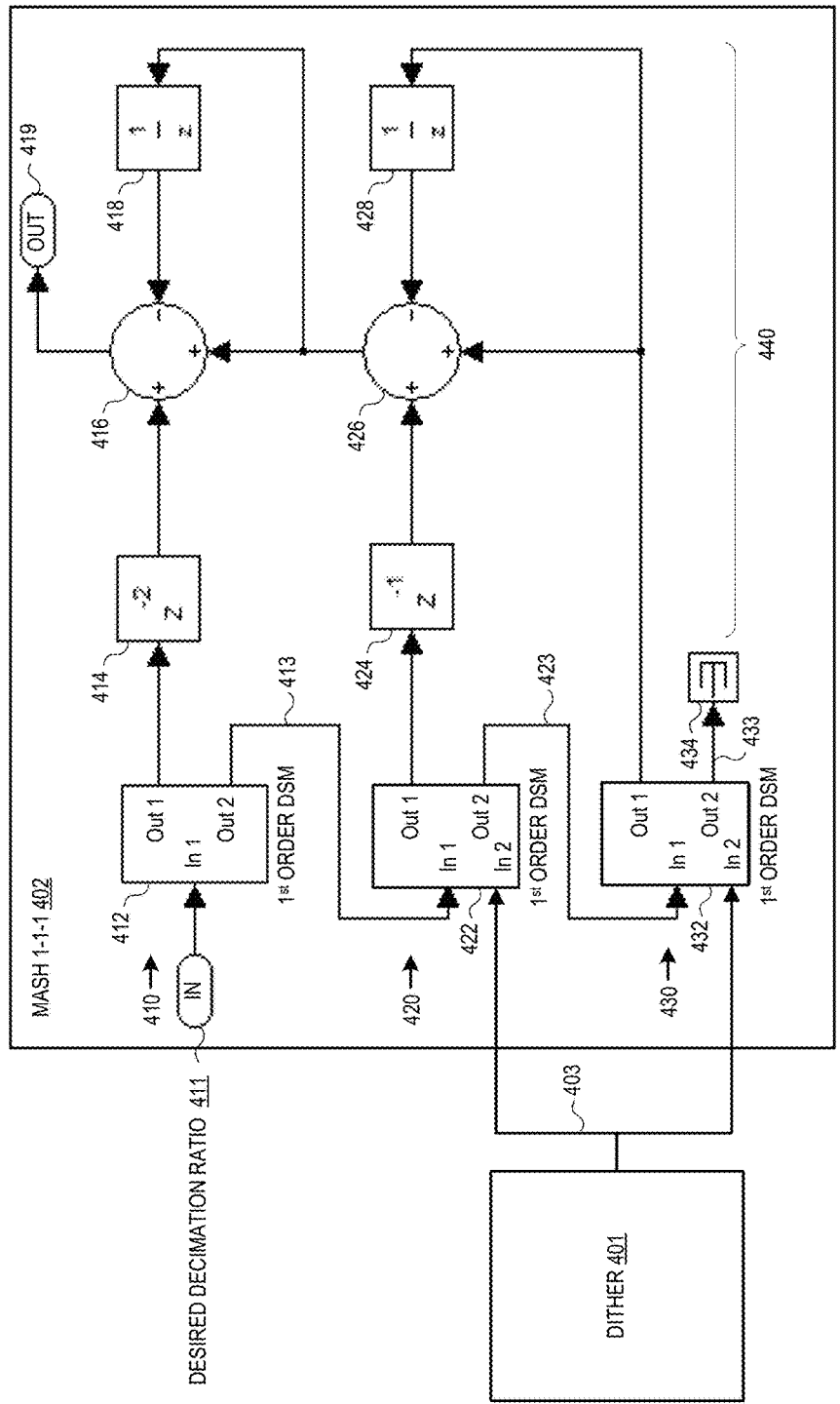
FIG. 4 depicts circuit schematic diagram of a MASH delta-sigma modulator with input dithering in accordance with selected embodiments of the present disclosure.

To provide an example illustration of a suitable implementation for the delta-sigma modulator 310, reference is now made to FIG. 4 which depicts a simplified schematic circuit diagram 400 of a MASH delta-sigma modulator 402 with an input dither circuit 401. As will be appreciated, any suitable MASH delta-sigma modulator may be used, and may include multiple stages which may be either order 1 or 2, including but not limited to a MASH 1-1-1, MASH 1-1-1-1, MASH 2-1, MASH 2-2, MASH 2-1-1, or the like. In FIG. 4, the depicted MASH delta-sigma modulator 402 and input dither circuit 401 are connected and configured to receive an input signal 411 and to generate therefrom a digital output signal 419. The input signal 411 may be provided as a control word or value which specifies the desired decimation ratio with a required multi-bit precision (e.g., 24 bits). The digital output signal 419 may be provided as an output to the limited integrator which specifies the modulated output with a multi-bit precision (e.g., 8 bits).

In selected embodiments, the MASH delta-sigma modulator 402 may be constructed as a MASH 1-1-1 modulator having a plurality of cascaded first-order DSMs 412, 422, 432 which are connected in a corresponding plurality of digital DSM stages 410, 420, 430. In the example MASH 1-1-1 DSM 402, the quantization error (Out2) outputs of each stage 410, 420, 430 is fed to the next stage, and the digital output signals (Out2) of each stage 410, 420, 430 are combined in a noise shaping block 440 that cancels the noise from the previous stages by producing multi-bit outputs that exhibit the third order noise shaping characteristics. In the first stage 410, a first order DSM 412 receives the desired decimation ratio signal 411 as a multi-bit (e.g., 24 bits) input signal, and generates a first stage multi-bit (e.g., 8 bits) digital output signal (Out1) and a multi-bit (e.g., 24 bits) quantization error output signal (Out2) 413, with the first stage multi-bit digital output signal (Out1) being supplied to the unit delay operator 414 to provide a delay of two sampling intervals ($z^{-2}$) before being combined at the first accumulator 416 with the multi-bit output from the second stage 420 and the unit delayed multi-bit output from the second stage 420 via unit delay operator 418. The first stage quantization error output signal (Out2) 413 from the first order DSM 412 is fed to the second stage 420 which includes a first order DSM 422 that is connected to generate a second stage digital output signal (Out1) and a quantization error output signal (Out2) 423, with the second stage digital output signal (Out1) being supplied to the unit delay operator 424 to provide a sampling interval delay ($z^{-1}$) before being combined at the second accumulator 426 with the output from the third stage 430 and the unit delayed output from the third stage 430 via unit delay operator 428. Finally, the second stage quantization error output signal (Out2) 423 is fed to the third stage 430 which includes a first order DSM 432 that is connected to receive the second stage quantization error output signal (Out2) 423 and to generate a third stage digital output signal (Out1) and a quantization error output signal (Out2), with the third stage digital output signal (Out1) being supplied to the unit delay operator 428 and the second accumulator 426. The third stage quantization error output signal (Out2) 433 may be ignored or terminated at the output 434.

To help reduce DSM tonal behavior, the dither circuit 401 is used to help randomize the behavior of the MASH 1-1-1 modulator by introducing noise in one or more of the digital DSM stages 410, 420, 430. While any suitable white noise or random noise generator circuit may be used, selected embodiments of the dither circuit 401 may employ one or more pseudorandom number sequence generators which have their PN sequence amplified, summed, subtracted, and/or multiplied by one or more values to generate the dither input value(s) 403. For example, the dither circuit 401 may provide a one-bit random sequence dither input value 403 as an input to the second and third digital DSM stages 420, 430, or to all stages of the MASH 1-1-1 modulator. To this end, the dither circuit 401 provides the random sequence 403 to the input (In2) of the single bit quantizer in the first order DSM 422 of the second DSM stage 420 and to the input (In2) of the single bit quantizer in the first order DSM 432 of the third DSM stage 430.

In the decimation/interpolation engine configuration, the limited integrator 320 may be implemented with any suitable design for summing or accumulating the modulated desire rate change signal 302 and timing correction signal 308 under control of the feedback clock signal 305 to generate pulse swallowing/pulse insertion commands 304 and fractional time shift commands 303. In addition, the clock generator 330 may be implemented with any suitable clocking circuit which receives a reference oscillator signal from a reference oscillator (RO) 331 and generates therefrom an output clock signal 305 in which clock pulses are swallowed or inserted in response to the pulse swallowing/pulse insertion commands 304. By providing the output clock signal 305 in feedback to the limited integrator 320 for integration with the modulated desire rate change signal 302, the limited integrator 320 keeps an account of the incoming sample times and the outgoing sample times. In addition, the limited integrator 320 uses the feedback clock signal 305 to generate fractional time shift/interpolation commands 303 to the timing shift filter 340.

In selected embodiments, the limited integrator 320 may be configured to generate the time shift command 303 (e.g., "X.Res") which has two components, X and Res. In such embodiments, the X component may be an integer value (e.g., 1) which denotes what integer offset to draw the interpolation buffer from, and which may be bounded with a specified range (e.g., X is bounded between 1 and 3 samples). In addition, the Res component may specify a fractional interpolation (e.g., 0.1) for a predefined resolution value, $0 \leq Res < 1$ (or $-\frac{1}{2} \leq Res < \frac{1}{2}$ depending on the type of interpolator as is known in the art). For example, the Res component may specify a fixed resolution value (e.g., $\frac{1}{16}$) of a sample time.

In addition, the limited integrator 320 may be configured to generate the pulse swallowing/pulse insertion commands 304 for input to the clock generator 330. In selected embodiments, the pulse swallowing/insertion command 304 may be coded with a "+1" values for a pulse swallowing event, and with a "−1" value for a pulse insertion event. When the pulses 304 are positive, the clock generator 330 swallows pulses, effectively configuring the fractional resampler 300 as a decimator. However, when the pulses 304 are negative, the clock generator 330 inserts pulses, effectively configuring the fractional resampler 300 as an interpolator.

As seen from the foregoing description, the limited integrator 320 keeps an account of the incoming sample times and the outgoing sample times by using the incoming samples as units of time. Every time an incoming command "u" is received, the limited integrator 320 interprets it as applied to the next incoming sample unless there was a pulse swallow or a pulse insertion. To this end, an internal timing accumulator keeps track of the relative time value (Time) between incoming commands received at the limited integrator 320 as follows:

Time=u+Time−1 (if there is no pulse swallow or insertion)

Time=u+Time−2 (if there is a pulse swallow event)

Time=u+Time (if there is a pulse insertion)

As disclosed, if the value of u that is received as the incoming command to the integrator 320 is $0 \leq u \leq 1$, then interpolation takes place using the predefined resolution. However, if the received command value u>1, then decimation takes place.

In selected embodiments, the clock generator 330 may be configured to generate a pulse-swallowed clock signal 305. In such embodiments, the clock generator 330 responds to pulse swallowing commands 304 to skip over pulses of the system clock signal (as described with reference to FIG. 7). In addition, the clock generator 330 may be configured to generate a pulse-inserted clock signal 305. In such embodiments, the clock generator 330 responds to pulse insertion commands 304 to insert pulses into the clock signal 305.

As disclosed herein, the timing shift filter 340 may be configured to provide an arbitrary adjustment to the incoming sample rate 306 in response to the time shift commands 303 and the pulse-swallowed clock signal 305, thereby generating an output sampling rate 307. By receiving pulse swallowed clock signal 305 from the clock generator 330, the timing shift filter 340 may reduce the output sampling rate 307. Conversely, the timing shift filter 340 may respond to the time shift commands 303 by increasing the output sample rate 307 (interpolation). In this way, the timing shift filter 340 may provide an unbounded timing correction range for the output sampling rate.

Figure 5:
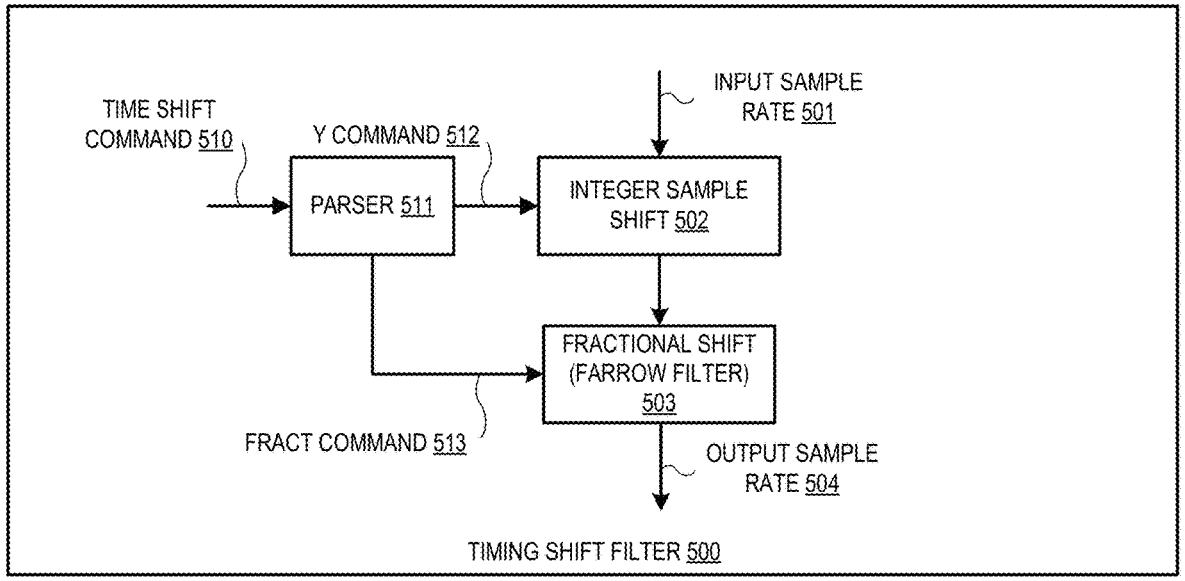
FIG. 5 depicts a simplified block diagram of a timing shift filter in accordance with selected embodiments of the present disclosure.

To provide additional details for an improved contextual understanding of the present disclosure, reference is now made to FIG. 5 which depicts a simplified block diagram of a timing shift filter 500 which performs a sampling rate conversion on the input sample rate 501 to generate an output sample rate 504 having a changed sampling rate in response to the time shift command 510. In the depicted embodiment, the input sampling rate 501 is converted to an output sampling rate 504 by using the integer sample shift module 502 and fractional shift module 503 which are controlled by a time shift command 510. While any suitable command format may be used, selected embodiments of the present disclosure may format the time shift command 510 as an X.Res interpolation command, where the "X" component specifies an integer delay value within a specified range (e.g., 1-3) or a nominal value (e.g., 2), and where the "Res" component specifies a delay command value, $0 \leq Res < 1$ (or $-\frac{1}{2} \leq Res < \frac{1}{2}$ depending on the type of interpolator as is known in the art).

To process the time shift command 510, the timing shift filter 500 may include a command parser 511 which internally converts the X.Res interpolation command into an integer "Y" command 512 and a fractional "Fract" command 513. In response to the "Y" command 512, an integer sample shift is applied to the input sample rate 501 by the integer sample shift module 502, followed by application of a fractional shift by the fractional shift module 503 in response to the "Fract" command 513. In selected embodiments, the fractional shift module 503 may be implemented with any suitable polynomial-based interpolation filter, such as a Farrow filter.

While the command parser 511 may employ any suitable conversion algorithm for processing the time shift command 510, selected embodiments of the present disclosure configure the command parser 511 to convert the X.Res interpolation command into the Y.Fract command so that the "Fract" command has a value within a defined range (e.g., $-0.5 < Fract \leq 0.5$) and so that the requirements of the equation, X+Res=Y+Fract, are met. This transformation is needed for implementing the fractional shift module 503 as a Farrow filter implementation which is suited to fractional interpolation in the [−0.5,0.5) range.

There are numerous advantages from constructing an arbitrary timing rate adjustment engine with a multi-stage power-of-two decimator cascade and fractional resampler that can be used to inject a delay or advance on the signal sample rate that can be tailored to any desired sampling rate change. First, the design of the decimator cascade avoids the complexity of single CIC decimator or non-integer decimator designs and thus eliminates the performance constraints of using very large decimation ratios. Second, the design of the fractional resampler to inject a signal into the limited integrator enables a delay to be achieved if a positive constant is added to the limited integrator, and allows an advance to be achieved if a negative constant is added to the limited integrator. In this way, small adjustment constants can be applied without limitation so that the cumulative sum of adjustments has no range restriction both in timing advance or retard operations.

In addition to being used to provide arbitrary timing rate adjustments, the fractional resampler may be used in selected timing error correction engine embodiments to actively correct for timing drift by responding to active advance and retard signals. In such timing error correction engine embodiments, a second control word 301 having a dynamically changing value may be supplied to configure the fractional resampler device 300 as a timing error correction engine wherein a timing correction signal 308 is injected at the limited integrator 320 which provides time shift commands 303 to the timing shift filter 340 and pulse swallowing/pulse insertion commands 304 to the clock generator 330 for implementing a timing tracking algorithm that can adjust for small timing errors (e.g., 200 ppm) by issuing fractional timing shift commands to the timing shift filter which has a fixed correction range. In this timing error correction timing error correction configuration, the fractional resampler device 300 receives the second control word 301 which dynamically changes in response to estimated timing errors. In response to the second control word 301, the timing correction signal 308 is injected into the limited integrator 320 where it is accumulated or integrated with the feedback clock signal 305 from the clock generator 330, thereby generating fractional time shift commands 303 and pulse swallowing/pulse insertion commands 304.

Figure 6:
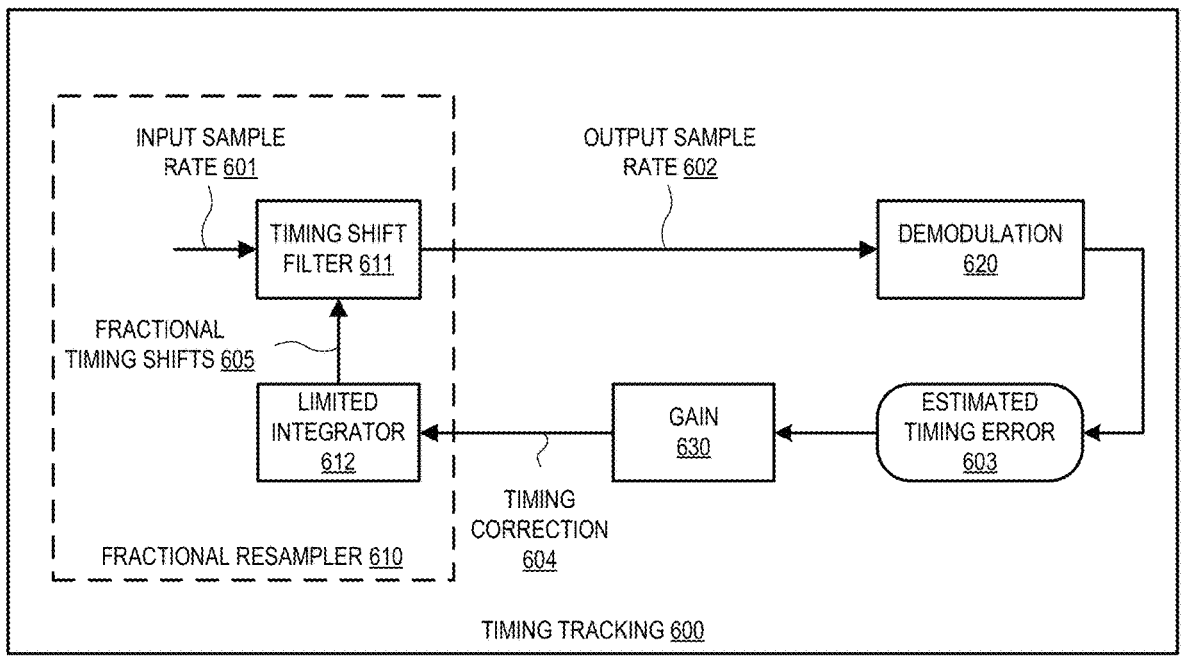
FIG. 6 depicts a timing tracking operation which uses a fractional resampler decimator to actively correct for timing drift in accordance with selected embodiments of the present disclosure.

To provide an example illustration of a suitable implementation for the timing error correction engine, reference is now made to FIG. 6 which depicts a timing tracking operation 600 wherein a fractional resampler 610 is used to actively correct for timing drift in response to a timing correction signal 604. As depicted, the fractional resampler 610 includes a timing shift filter 611 that is connected and configured to provide arbitrary timing correction adjustments to the incoming sample rate 601 in response to fractional timing shift commands 605 and to generate a timing-corrected output sampling rate 602. To generate the timing correction signal 604, the digital demodulator 620 processes the output sampling rate 602 to detect an estimated timing error 603 which identifies a timing error advance or delay amount. At the gate stage 630, the estimated timing error 603 is processed generate a controllable timing correction command 604 which is usually limited to be less than the estimated timing error 603, thereby reducing the chance of error correction overshoot if the estimated timing error 603 is incorrect. The timing correction signal 604 is provided to the limited integrator 612 which is configured to inject a delay or advance on the input sample rate 601. In selected embodiments, if the timing correction signal 604 adds a positive constant to the limited integrator 612, a fractional timing shift 605 is issued to achieve a delay. However, if the timing correction signal 604 adds a negative constant to the limited integrator 612, a fractional timing shift 605 is issued to achieve an advance. In this way, the timing correction 604 may apply small adjustment constants to the limited integrator 612, and the cumulative sum of these small adjustments has no range restriction both in timing advance or retard.

Figure 7:
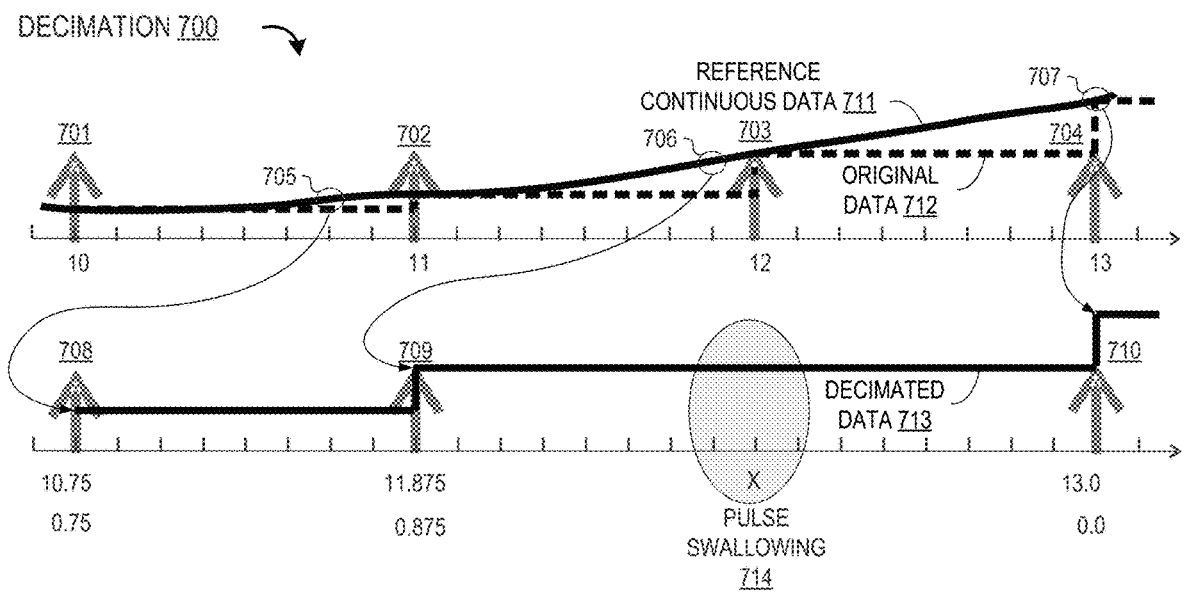
FIG. 7 depicts a timing diagram illustration of the clocking and timing shifts to implement swallowing or insertion of pulses in accordance with selected embodiments of the present disclosure.
Figure 7:
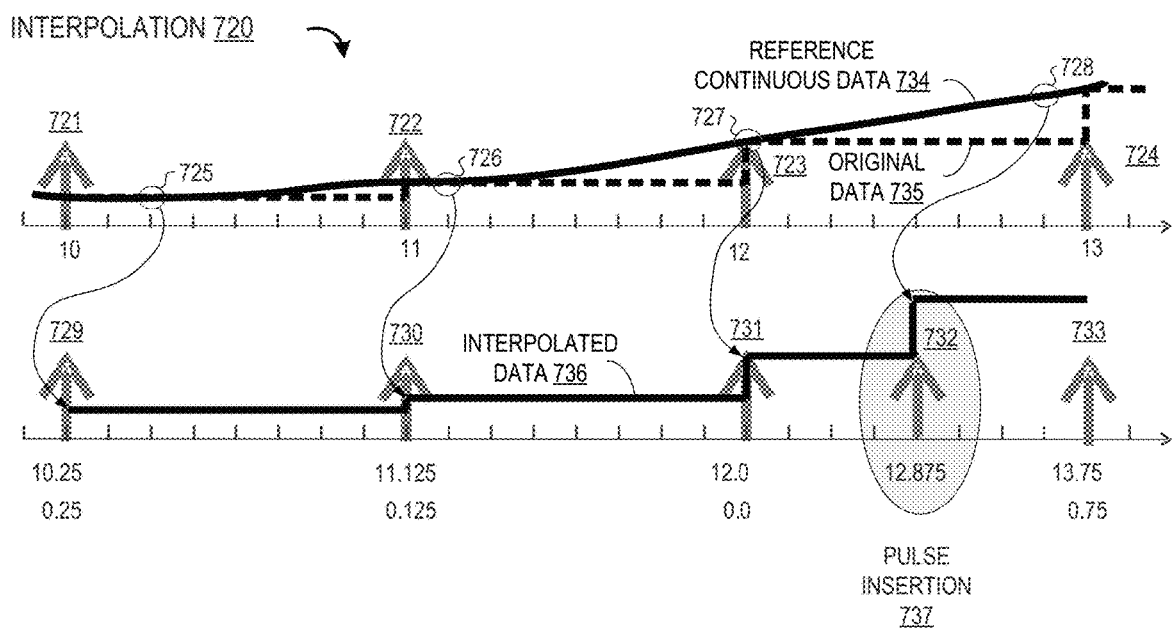

To provide additional details for an improved contextual understanding of the present disclosure, reference is now made to FIG. 7 which depicts a timing diagram illustration of the clocking and timing shifts for implementing a decimation scenario 700 (where a sampling clock pulse is swallowed) and an interpolation scenario 720 (where a sampling clock pulse is inserted). In both the decimation scenario 700 and interpolation scenario 720, the continuously interpolated reference data is shown as a solid trace line 711, 734, respectively, which represents a continuously interpolated input data that is described by sample numbers (samples 10 to 13 are illustrated) and their values. Along the reference continuous data lines 711, 734, the output sample locations for the decimation (705-707) and interpolation (725-728) are respectively indicated. And assuming a zero-order hold, the original digital input data 712 for the decimation scenario 700 is shown as a dashed line 712 with input sample locations 701-704, while the original digital input data 735 for the interpolation scenario 720 is shown as a dashed line 735 with input sample locations 721-724.

With the depicted decimation scenario 700, the decimation factor of 1.125=1⅛ is illustrated between the output sample locations 705-707 shown on the continuously interpolated reference data trace 711. On the decimated data trace 713, this decimation results in a first sample at location 708 at 10.75 (which corresponds to the sample indicator 705 on the continuously interpolated reference data line 711) and second sample at data location 709 at 11.875 (which corresponds to the sample indicator 706 in the continuously interpolated reference data line 711) that is spaced apart by 1.125 samples. However, since there is no sample indicators on the continuously interpolated reference data line 711 between the sample locations 703 and 704, a pulse swallow command is used to swallow the clock pulse 714 in the decimated data trace 713, thereby slowing the sampling rate of the decimated data.

Conversely, the interpolation scenario 720 has an example decimation factor of 7/8=0.875 between output sample locations 725-728, resulting in an interpolated data trace 736 having a first interpolated sample at location 729 at 10.25 (which corresponds to the sample indicator 725 on the continuously interpolated reference data line 734) and interpolated data of 8/7=1.1428, with the data locations being spaced 7/8 samples apart. Since there are two sample locations 727, 728 between the sample locations 723 and 724, an additional clock pulse sample location 732 is inserted 737 in the interpolated data trace 736 at sample location 12.875, thereby increasing the sampling rate of the interpolated data. Note that the sampling locations are based on a grid of finer possible sampling points provided by the reference oscillator (a crystal reference oscillator or a derived reference thereof.) Further note that the decimation does not introduce new sample locations but the interpolation does.

By now it should be appreciated that there has been provided an arbitrary rate digital decimator filter apparatus, system, architecture, and methodology for filtering an input digital signal at an arbitrary resampling rate. The disclosed arbitrary rate digital decimator filter includes an input to receive a digital data stream. The arbitrary rate digital decimator filter also includes a plurality of cascaded power-of-two decimator stages connected to receive the digital data stream from the input and to generate a first filtered digital signal, each power-of-two decimator stage being configured to decimate a sampling rate for a received digital input signal by a specified power-of-two. In selected embodiments, the arbitrary rate digital decimator filter includes an automatic gain control stage connected to an output of each power-of-two decimator stage. In selected embodiments, the plurality of cascaded power-of-two decimator stages include a first power-of-two decimator stage connected to receive the digital data stream and to generate a first digital output, the first power-of-two decimator stage having a relatively low decimation factor. In such embodiments, an automatic gain control and downconverter stage may be connected immediately after the first power-of-two decimator stage. In selected embodiments, the plurality of cascaded power-of-two decimator stages includes a second power-of-two decimator stage connected to receive the first digital output and to generate a second digital output, the second power-of-two decimator stage having a relatively large decimation factor compared to the first decimation factor. In such embodiments, an automatic gain control and compensation stage may be connected immediately after the second power-of-two decimator stage. In addition, a half-band decimator may be connected immediately after the automatic gain control and compensation stage. In addition, the arbitrary rate digital decimator filter includes a fractional resampling stage connected to receive the first filtered digital signal and to generate a second filtered digital signal, the fractional resampling stage comprising a delta-sigma modulator and a limited integrator stage connected to receive a first control word and a feedback clock signal with inserted and/or swallowed pulses which is generated by a clock generator in response to pulse commands generated by the limited integrator stage, wherein the limited integrator is configured to generate time shift commands to a timing shift filter which performs fractional interpolation on the first filtered digital signal to generate the second filtered digital signal. In selected embodiments, the delta-sigma modulator is a MultistAge noise SHaping (MASH) delta-sigma modulator that can have multiple stages. The timing shift filter may include a command parser connected to parse time shift commands into first and second control commands for controlling, respectively, an integer sample shifter and a fractional shifter which are connected to resample an input sample rate received at the integer sample shifter into an output sample rate output by the fractional shifter. In selected embodiments, the arbitrary rate digital decimator filter includes a channel filter connected to an input of the fractional resampling stage. In selected embodiments of the disclosed arbitrary rate digital decimation filter, the delta-sigma modulator and limited integrator stage may be connected to receive a second control word and the feedback clock signal, wherein the limited integrator is configured to generate fractional time shift commands to the timing shift filter in response to the second control word and a timing correction signal injected into the limited integrator which represents an estimated timing error between the output sample rate and a target output sampling rate.

In another form, there is provided a variable rate decimation module, system, architecture, and methodology for filtering an input digital signal at an arbitrary resampling rate. The disclosed variable rate decimation module includes circuitry configured to implement a plurality of cascaded power-of-two decimator stages and a fractional resampling stage. In selected embodiments, an automatic gain control stage is connected to an output of each power-of-two decimator stage, and a channel filter is connected to an input of the fractional resampling stage. The cascaded power-of-two decimator stages are connected to receive a digital data stream at an input sampling rate and to generate a first filtered digital signal, wherein each of the plurality of cascaded power-of-two decimator stages is configured to decimate a sampling rate for a received digital input signal by a specified power-of-two factor which may be identical to or different from a specified power-of-two factor used by another of the plurality of cascaded power-of-two decimator stages. In selected embodiments, the cascaded power-of-two decimator stages may include a first power-of-two decimator stage connected to receive the digital data stream and to generate a first digital output; an automatic gain control and downconverter stage connected immediately after the first power-of-two decimator stage to generate a first downsampled digital output; and a second power-of-two decimator stage connected to receive the first downsampled digital output and to generate a second downsampled digital output, wherein the first power-of-two decimator stage has a relatively low decimation factor, and wherein the second power-of-two decimator stage has a relatively large decimation factor compared to the first decimation factor. In addition, the cascaded power-of-two decimator stages may include an automatic gain control and compensation stage connected immediately after the second power-of-two decimator stage; and a half-band decimator connected immediately after the automatic gain control and compensation stage. In addition, the fractional resampling stage is connected to receive the first filtered digital signal and to generate a second filtered digital signal at an output sampling rate. To this end, the fractional resampling stage includes a delta-sigma modulator (e.g., MASH delta-sigma modulator) connected to generate a modulated desired rate change signal in response to a first control word; a limited integrator stage connected to generate a time shift command signal and a pulse swallow/insert command signal in response to the modulated desired rate change signal and a modified clock signal; a clock generator connected to generate the modified clock signal in which clock pulses are swallowed or inserted in response to the pulse swallow/insert command signal; and a timing shift filter connected to receive the modified clock signal and the time shift command signal and to perform fractional interpolation on the first filtered digital signal to generate the second filtered digital signal. In selected embodiments, the timing shift filter may include a command parser connected to parse the time shift command signal into first and second control commands for controlling, respectively, an integer sample shifter and a fractional shifter which are connected to resample an input sample rate received at the integer sample shifter into a output sample rate output by the fractional shifter. In addition, the delta-sigma modulator and limited integrator stage may be connected to receive a second control word and the modified clock signal, wherein the limited integrator is configured to generate fractional time shift commands to the timing shift filter in response to the second control word and a timing correction signal injected into the limited integrator which represents an estimated timing error between the output sample rate and a target output sampling rate.

In yet another form, there is provided a method for performing arbitrary rate decimation and timing error correction. In the disclosed methodology, a digital data stream is received from an analog-to-digital converter at a source input. In addition, a first filtered digital signal is generated from the digital data stream using a plurality of cascaded power-of-two decimator stages, where each power-of-two decimator stage is configured to decimate a sampling rate for a received digital input signal by a specified power-of-two. In addition, a second filtered digital signal is generated from the first filtered digital data stream using a fractional resampler. As disclosed, the fractional resampler includes a delta-sigma modulator and a limited integrator stage connected to receive a first control word and a feedback clock signal with inserted and/or swallowed pulses which is generated by a clock generator in response to pulse commands generated by the limited integrator stage, wherein the limited integrator is configured to generate time shift commands to a timing shift filter which is configured to decimate a sampling rate for the first filtered digital signal by an arbitrary decimation rate, thereby generating the second filtered digital signal. In selected embodiments, the delta-sigma modulator and limited integrator stage are connected to receive a second control word and the feedback clock signal, wherein the limited integrator is configured to generate fractional time shift commands to the timing shift filter in response to the second control word and a timing correction signal injected into the limited integrator which represents an estimated timing error between the output sample rate and a target output sampling rate.

Although the exemplary embodiments are described herein with reference to a frequency shift key (FSK) receiver device which includes an arbitrary rate digital decimation architecture which, the present disclosure is not necessarily limited to the example embodiments illustrate herein and may be applied to any receiver or transceiver which requires a digital decimation filter which provides an arbitrary resampling gate. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above regarding specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An arbitrary rate digital decimator filter, comprising:
an input to receive a digital data stream;
a plurality of cascaded power-of-two decimator stages connected to receive the digital data stream from the input and to generate a first filtered digital signal, each power-of-two decimator stage being configured to decimate a sampling rate for a received digital input signal by a specified power-of-two; and
a fractional resampling stage connected to receive the first filtered digital signal and to generate a second filtered digital signal, the fractional resampling stage comprising a delta-sigma modulator and a limited integrator stage connected to receive a first control word and a feedback clock signal with inserted or swallowed pulses which is generated by a clock generator in response to pulse commands generated by the limited integrator stage, wherein the limited integrator is configured to generate time shift commands to a timing shift filter which performs fractional interpolation on the first filtered digital signal to generate the second filtered digital signal.

2. The arbitrary rate digital decimator filter of claim 1, further comprising an automatic gain control stage connected to an output of each power-of-two decimator stage.

3. The arbitrary rate digital decimator filter of claim 1, further comprising a channel filter connected to an input of the fractional resampling stage.

4. The arbitrary rate digital decimator filter of claim 1, where the delta-sigma modulator comprises a Multi-stAge noise Shaping (MASH) delta-sigma modulator.

5. The arbitrary rate digital decimator filter of claim 1, where the plurality of cascaded power-of-two decimator stages comprises a first power-of-two decimator stage connected to receive the digital data stream and to generate a first digital output, the first power-of-two decimator stage having a first decimation factor.

6. The arbitrary rate digital decimator filter of claim 5, further comprising an automatic gain control and downconverter stage connected immediately after the first power-of-two decimator stage.

7. The arbitrary rate digital decimator filter of claim 5, where the plurality of cascaded power-of-two decimator stages comprises a second power-of-two decimator stage connected to receive the first digital output and to generate a second digital output, the second power-of-two decimator stage having a second decimation factor that is larger than the first decimation factor.

8. The arbitrary rate digital decimator filter of claim 7, further comprising an automatic gain control and compensation stage connected immediately after the second power-of-two decimator stage.

9. The arbitrary rate digital decimator filter of claim 8, further comprising a half-band decimator connected immediately after the automatic gain control and compensation stage.

10. The arbitrary rate digital decimator filter of claim 1, where the timing shift filter comprises a command parser connected to parse time shift commands into first and second control commands for controlling, respectively, an integer sample shifter and a fractional shifter which are connected to resample an input sample rate received at the integer sample shifter into a output sample rate output by the fractional shifter.

11. The arbitrary rate digital decimator filter of claim 1, where the delta-sigma modulator and limited integrator stage are connected to receive a second control word and the feedback clock signal, wherein the limited integrator is configured to generate fractional time shift commands to the timing shift filter in response to the second control word and a timing correction signal injected into the limited integrator which represents an estimated timing error between the output sample rate and a target output sampling rate.

12. A variable rate decimation module, comprising circuitry configured to implement:
a plurality of cascaded power-of-two decimator stages connected to receive a digital data stream at an input sampling rate and to generate a first filtered digital signal; and
a fractional resampling stage connected to receive the first filtered digital signal and to generate a second filtered digital signal at an output sampling rate;
wherein each of the plurality of cascaded power-of-two decimator stages is configured to decimate a sampling rate for a received digital input signal by a specified power-of-two factor which may be identical to or different from a specified power-of-two factor used by another of the plurality of cascaded power-of-two decimator stages; and
wherein the fractional resampling stage comprises:
a delta-sigma modulator connected to generate a modulated desired rate change signal in response to a first control word,
a limited integrator stage connected to generate a time shift command signal and a pulse swallow/insert command signal in response to the modulated desired rate change signal and a modified clock signal,
a clock generator connected to generate the modified clock signal in which clock pulses are swallowed or inserted in response to the pulse swallow/insert command signal, and
a timing shift filter connected to receive the modified clock signal and the time shift command signal and to perform fractional interpolation on the first filtered digital signal to generate the second filtered digital signal.

13. The variable rate decimation module of claim 12, further comprising:
an automatic gain control stage connected to an output of each power-of-two decimator stage; and
a channel filter connected to an input of the fractional resampling stage.

14. The variable rate decimation module of claim 12, where the delta-sigma modulator comprises a Multi-stAge noise SHaping (MASH) delta-sigma modulator.

15. The variable rate decimation module of claim 12, where the plurality of cascaded power-of-two decimator stages comprises:
a first power-of-two decimator stage connected to receive the digital data stream and to generate a first digital output;
an automatic gain control and downconverter stage connected immediately after the first power-of-two decimator stage to generate a first downsampled digital output; and
a second power-of-two decimator stage connected to receive the first downsampled digital output and to generate a second downsampled digital output;
wherein the first power-of-two decimator stage has a first decimation factor; and
wherein the second power-of-two decimator stage has a second decimation factor that is larger than the first decimation factor.

16. The variable rate decimation module of claim 15, further comprising:
an automatic gain control and compensation stage connected immediately after the second power-of-two decimator stage; and
a half-band decimator connected immediately after the automatic gain control and compensation stage.

17. The variable rate decimation module of claim 12, where the timing shift filter comprises a command parser connected to parse the time shift command signal into first and second control commands for controlling, respectively, an integer sample shifter and a fractional shifter which are connected to resample an input sample rate received at the integer sample shifter into a output sample rate output by the fractional shifter.

18. The variable rate decimation module of claim 12, where the delta-sigma modulator and limited integrator stage are connected to receive a second control word and the modified clock signal, wherein the limited integrator is configured to generate fractional time shift commands to the timing shift filter in response to the second control word and a timing correction signal injected into the limited integrator which represents an estimated timing error between the output sample rate and a target output sampling rate.

19. A method comprising:
receiving a digital data stream from an analog-to-digital converter at a source input;
generating a first filtered digital signal from the digital data stream using a plurality of cascaded power-of-two decimator stages, wherein each power-of-two decimator stage is configured to decimate a sampling rate for a received digital input signal by a specified power-of-two; and generating a second filtered digital signal from the first filtered digital data stream using a fractional resampler comprising a delta-sigma modulator and a limited integrator stage connected to receive a first control word and a feedback clock signal with inserted or swallowed pulses which is generated by a clock generator in response to pulse commands generated by the limited integrator stage, wherein the limited integrator is configured to generate time shift commands to a timing shift filter which is configured to decimate a sampling rate for the first filtered digital signal by an arbitrary decimation rate, thereby generating the second filtered digital signal.

20. The method of claim 19, where the delta-sigma modulator and limited integrator stage are connected to receive a second control word and the feedback clock signal, wherein the limited integrator is configured to generate fractional time shift commands to the timing shift filter in response to the second control word and a timing correction signal injected into the limited integrator which represents an estimated timing error between the output sample rate and a target output sampling rate.

* * * * *